United States Patent [19]
Knotts et al.

[11] Patent Number: 5,841,325
[45] Date of Patent: Nov. 24, 1998

[54] FULLY-INTEGRATED HIGH-SPEED INTERLEAVED VOLTAGE-CONTROLLED RING OSCILLATOR

[75] Inventors: Thomas A. Knotts, Palo Alto; Cheryl Stout, Fremont; Richard C. Walker, Palo Alto, all of Calif.

[73] Assignee: Hewlett-Packard Company, Palo Alto, Calif.

[21] Appl. No.: 854,429

[22] Filed: May 12, 1997

[51] Int. Cl.$^6$ ....................................... H03B 5/24
[52] U.S. Cl. ........................... 331/57; 331/45; 331/177 R
[58] Field of Search .................. 331/34, 45, 57, 331/177 R

[56] References Cited

U.S. PATENT DOCUMENTS

| | | | |
|---|---|---|---|
| 4,884,041 | 11/1989 | Walker | 331/57 |
| 5,592,126 | 1/1997 | Boudewijns et al. | 331/57 X |
| 5,592,127 | 1/1997 | Mizuno | 331/57 |

OTHER PUBLICATIONS

Maneatis, John G. et al, "Precise Delay Generation Using Coupled Oscillators", IEEE Jounal of Solid–State Circuits, vol. 28, No. 12, Dec. 1993. pp. 1273–1293.

Rofougaran, Ahmadraza et al., "A 900MHz CMOS LC–Oscillator with Quadrature Outputs", 1996 IEEE International Solid–State Circuits Conference, ISSCC96, Session 24, Analog Technologies, Paper SP 24.6, pp. 392–393.

Knotts, Thomas A. et al., "A 500MHz Time Digitizer IC with 15.625ps Resolution", 1994 IEEE International Solid–State Circuits Conference, ISSCC94, Session 3, Analog Technologies, Paper WP 3.6 pp. 58–59.

*Primary Examiner*—David Mis

[57] ABSTRACT

An interleaved, tunable ring oscillator is disclosed that produces more output phases without resorting to interpolation. The oscillator is inherently symmetrical and suffers from none of the systematic time errors of an interpolator approach. The oscillator stages are interconnected to allow the oscillating frequency to be higher than the conventional limit of $1/(2*N*T_D)$. Frequency tuning is accomplished by electronically varying the delay of each stage of the ring oscillator. A mixer cell performs a weighted sum of a first input and a second delayed input. The delay ranges from the delay of the mixer itself to the sum of the delays of the mixer and the delay cell.

20 Claims, 6 Drawing Sheets

A = 0.5C' + 0.5D'
B = 0.5D' + 0.5A
C = 0.5A + 0.5B
D = 0.5B + 0.5C

FULLY-INTEGRATED HIGH-SPEED INTERLEAVED VOLTAGE-CONTROLLED RING OSCILLATOR

BACKGROUND OF THE INVENTION

1. Technical Field

The invention relates to monolithic integrated oscillators. In particular, the invention relates to tunable ring oscillators that provide precise multi-phase outputs.

2. Description of the Prior Art

Ring oscillators have been widely used in communication systems. FIG. 1 is an illustration of a conventional ring oscillator 10. This oscillator consists of N cells 12, each having a gate delay of $T_D$, connected such that there is an overall inversion in the loop. If a rising logic transition propagates around the ring it will, after one round trip, become a falling edge. After two such trips, it will again be a rising edge. Since the time of propagation around the loop is $N*T_D$, the period of the generated signal will be $2*N*T_D$. Equivalently, this circuit oscillates at a frequency of $1/(2*N*T_D)$. Various methods have been used to adjust $T_D$ and thereby create a tunable oscillator.

N separate outputs are available from the ring oscillator 10 in FIG. 1, one output from each of the cells 22 in the chain. If both the true and complementary versions of each output are taken, then $2*N$ different output clock phases are available. The time delay between each of these phase-shifted clocks is equal to one gate delay $T_D$.

In many applications it may be desirable to have more delay subdivisions than the $2*N$ phases of the simple oscillator. For example, if an oscillator with a frequency of 2.5 GHz is used in a system with a gate delay $T_D$ of 100 ps, then the oscillator must consist of 2 gates such that the frequency $1/(2*2*100 \text{ ps})=2.5$ GHz. Such a two cell oscillator will have four output phases. If the application for this oscillator requires more than 4 evenly-spaced phases, say 8 phases, then some way of providing interpolation is required.

In "A 500 MHz Time Digitizer IC with 15.625 ps Resolution", 1994 ISSCC Digest of Technical Papers", pp 58–9, T. Knotts et al. disclose a circuit that derives these interpolated phases using mixers. The inputs of the mixers are interconnected to act as delay-compensating buffers 24. FIG. 2a shows a ring oscillator 20 which generates extra phases by using interpolators 26, which are used to interpolate between edges generated by the ring-connected cells 22.

FIG. 2b shows an interpolating oscillator 27 for the special case when N=2. An intermediate phase (Out 1,2) is generated by taking an average between the voltages of the 0 and 90 degree outputs (Out 1 and Out 2). For ideal sine wave oscillation signals, this derived voltage will be at 45 degrees. A second averaging circuit interpolates between the 90 and 180 degree outputs (Out 2 and Out 1), yielding a 135-degree derived voltage at Out 2,1.

Since all practical interpolation circuits have an inherent gate delay, delay-compensating dummy interpolators 24 are used on the 0 and 90 degree outputs to maintain phase accuracy. By taking both true and complementary forms of the outputs of each interpolator 26, the number of phases available is doubled. This technique can be extended arbitrarily by multiple ranks of interpolators 26, with each stage doubling the number of available phases.

Using an external interpolator approach has several disadvantages. Interpolating over wide time intervals causes a slower rise time (dv)/(dt) at the interpolator output, thereby increasing jitter in subsequent stages. In addition, it is difficult to match the delay of the dummy interpolators 24 to the delay of the active interpolators 26. This leads to small, systematic timing errors.

In "Fully Integrated High-Speed Voltage Controlled Ring Oscillator", U.S. Pat. No. 4,884,041, R. Walker discloses a ring oscillator that has the advantages of being fully integrated, frequency-tunable and fully differential in both signal and tuning voltage. Two-wire, differential input and output signals within the circuit suppress on-chip power supply noise and crosstalk. Since each true and complementary signal individually contains similar noise and crosstalk patterns, the disclosed ring oscillator suppresses the noise by using differential signal pairs between these true and complementary signals.

Frequency tuning in the disclosed ring oscillator of Walker is accomplished by electronically varying the delay of each oscillator stage. FIG. 3 is a schematic diagram of an electronically-variable delay cell 30 that may be used as each of the delay cells in the disclosed ring oscillator of Walker. This variable delay cell 30 is based on a delay cell 32 connected to a delay-interpolating mixer 34. The delay-interpolating mixer 34 performs a weighted sum of a first input 36 and a second input 38 delayed by the delay cell 32. An analog tuning input 37 can be adjusted to vary the delay of the delay-interpolating mixer 34, such that the delay ranges from the delay of the delay-interpolating mixer 34 itself to the sum of the delays of the delay-interpolating mixer 34 and the delay cell 32. Further details of tuning the delay-interpolating mixer 34 are discussed below.

In "A 900 MHz CMOS LC-Oscillator with Quadrature Outputs", 1996 ISSCC Digest of Technical Papers", pp 392–393, Rofougaran et al. disclose an interleaved, differential oscillator, wherein the frequency is set by an integrated inductor L and by FET drain junction capacitance C, but the oscillator is not tunable.

In "Precise Delay Generation Using Couple Oscillators", IEEE Journal of Solid-State Circuits, Vol. 28, No. 12, December 1993, pp. 1273–1282, Maneatis et al. disclose an interleaved oscillator that is tunable, but is only single-ended. The tunability is accomplished using current starving CMOS techniques.

It would be advantageous to have an oscillator design that combines the benefits of a fully differential interconnection approach with frequency tunability and fractional phase differences.

SUMMARY OF THE INVENTION

A ring oscillator is disclosed that uses extra stages to produce more output phases without resorting to an external interpolator. The ring oscillator is inherently symmetric and suffers from none of the systematic time errors of an interpolator approach. The oscillator stages are interconnected in a way that allows the oscillation frequency to be higher than the traditional limit of $1/(2*N*T_D)$.

The improved ring oscillator includes stages that are interleaved in a manner giving time spacings between oscillator stages that are shorter than the delay of an individual stage. The oscillator frequency is still tunable, and the time spacing of the stages remains uniform over the entire tuning range. This allows the edge spacing $T_E$ to be shorter in time than the realizable gate delays $T_D$ without using interpolators.

BRIEF DESCRIPTION OF THE DRAWINGS

FIG. 4b is a signal flow graph description of FIG. 4a;

DETAILED DESCRIPTION OF THE INVENTION

In a traditional ring oscillator, each stage is connected to the next stage in series. In an interleaved ring oscillator, each stage has more than one input, and the inputs are connected to the output of more than one other stage. By interconnecting the stages in an interleaved configuration, more delay subdivisions than the 2*N phases of a traditional oscillator can be achieved, as discussed below.

Figure 3:
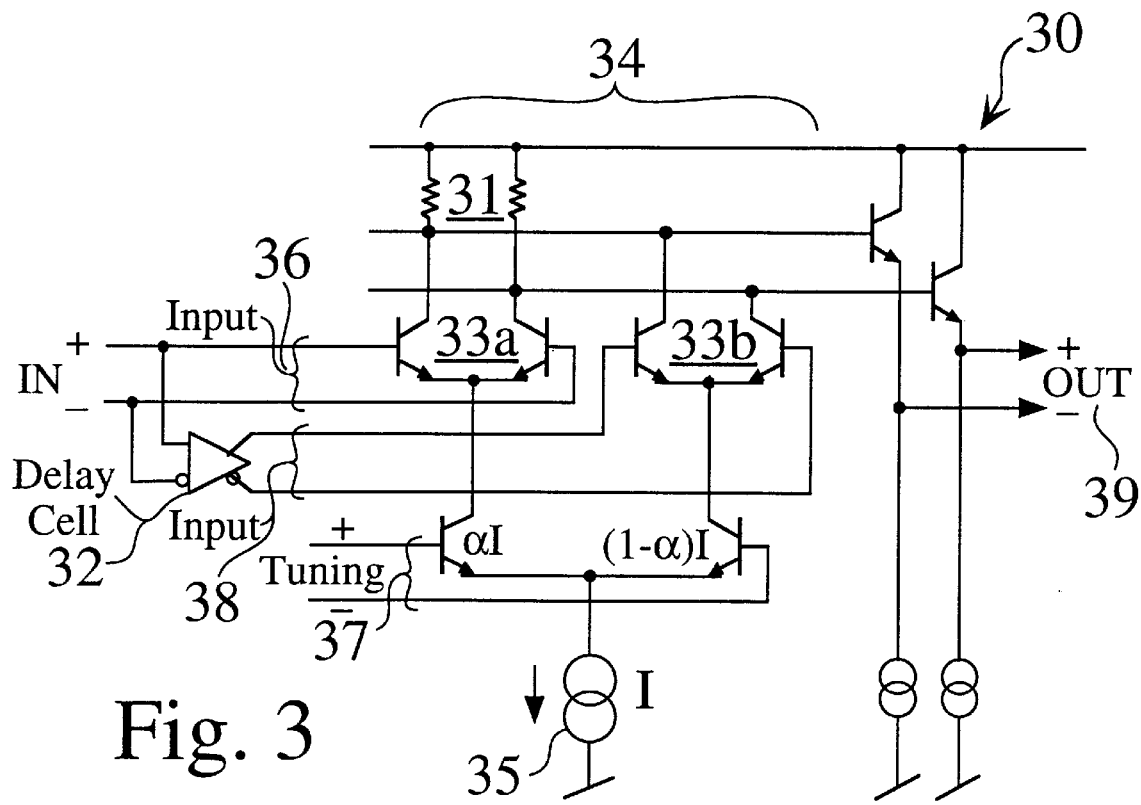
FIG. 3 shows a variable delay cell using a delay-interpolating mixer.
Figure 4A:
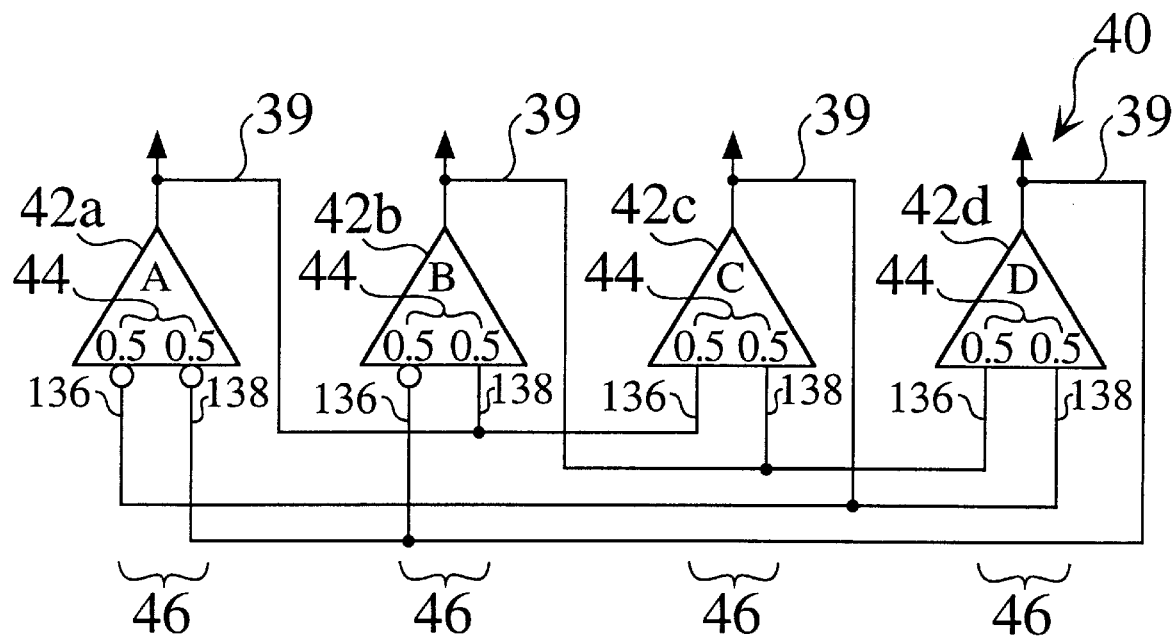
FIG. 4a shows a simplified circuit diagram of a non-tunable interleaved ring oscillator.
Figure 4B:
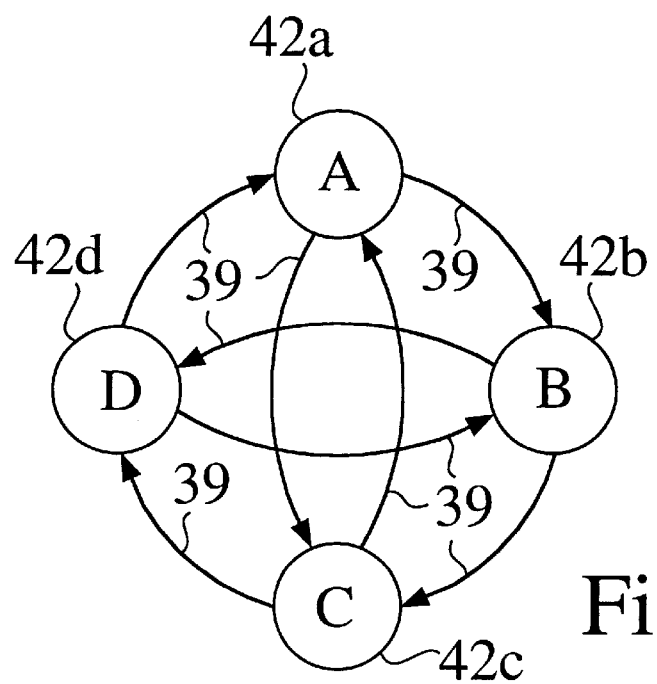

FIG. 4a shows a simplified circuit diagram of an interleaved ring oscillator 40. FIG. 4b shows a schematic signal-flow diagram of the symmetrical interconnection between the delay-interpolating mixer cells 42 shown in FIG. 4a. Each of the four stages A–D is a simple delay-interpolating mixer, similar to the delay-interpolating mixer 34 shown in FIG. 3. Each stage 46 of the interleaved ring oscillator 40 is comprised of a delay-interpolating mixer cell 42 that has two inputs 136 and 138, and an output 39.

Each delay-interpolating mixer cell 42 is connected to two other delay-interpolating mixer cells 42, as shown in FIGS. 4a and 4b, such that the two inputs of each delay-interpolating mixer cell 42 are connected to the outputs of two other cells, and the output of each delay-interpolating mixer cell 42 drives an input of two other delay-interpolating mixer cells 42. One of the inputs 138 of each cell 42 is connected to the output 39 of the stage 46 immediately to the left. The other of the inputs 136 of the cell 42 is connected to the output of the opposite cell 42. For example, the first input 136 of stage C is connected to the output 39 of stage A, the second input 138 of stage C is connected to the output 39 of stage B, and the output 39 of stage C is connected to the input 136 of stage A and to the input 138 of stage D. Note that the input 136 of stage A inverts the incoming signal from output 39 of stage C.

In each mixer cell 42 a–d, the two inputs 136 and 138 are combined with a predetermined weighting. The output 39 of each stage A–D includes a contribution from each of the inputs of the stage. In the preferred embodiment, the two inputs 136 and 138 of each mixer cell are combined with equal weighting so that the output of the stage is the average of the two inputs.

The resulting four-stage interleaved ring oscillator 40 can oscillate at a frequency of $1.5/(8*T_D)$, higher than the traditional limit of $1/(2*N*T_D)$. The oscillation frequency is discussed below for one tuning state (Equation 1) of a tunable interleaved ring oscillator 90 (FIG. 5), in which four stages A–D are interconnected in a similar manner to the interleaved ring oscillator 40.

Figure 1:
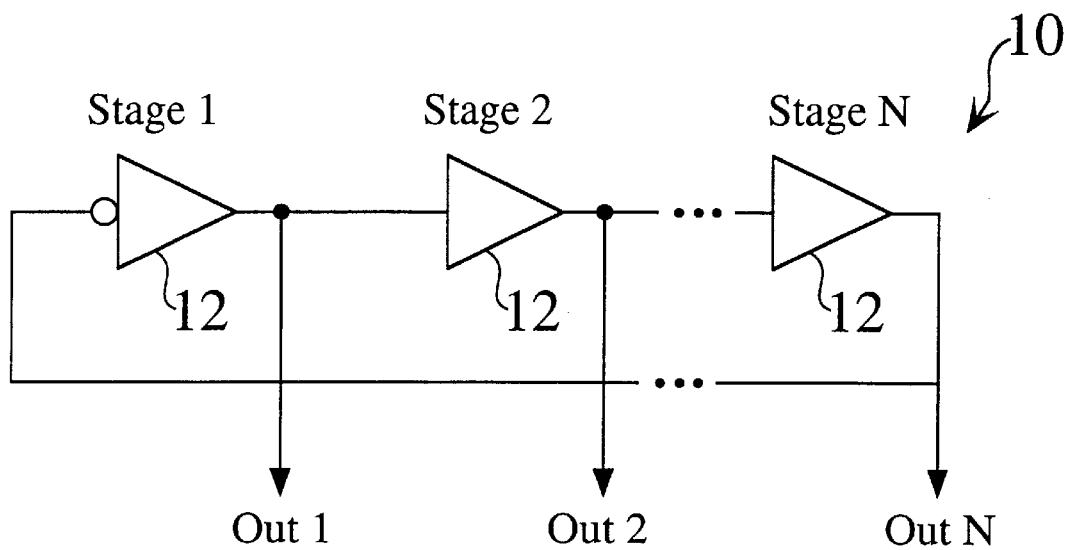
FIG. 1 is an illustration of a conventional ring oscillator.
Figure 2A:
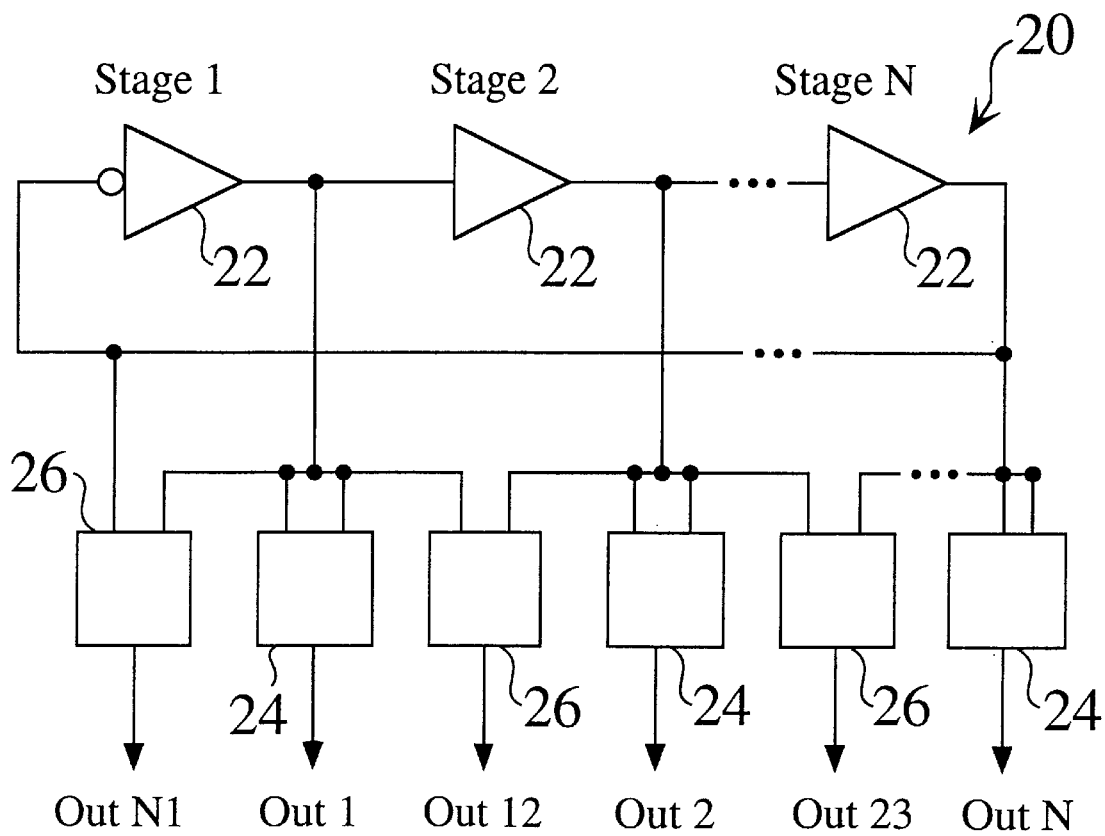
FIG. 2a illustrates generating extra phases by using interpolators.
Figure 2B:
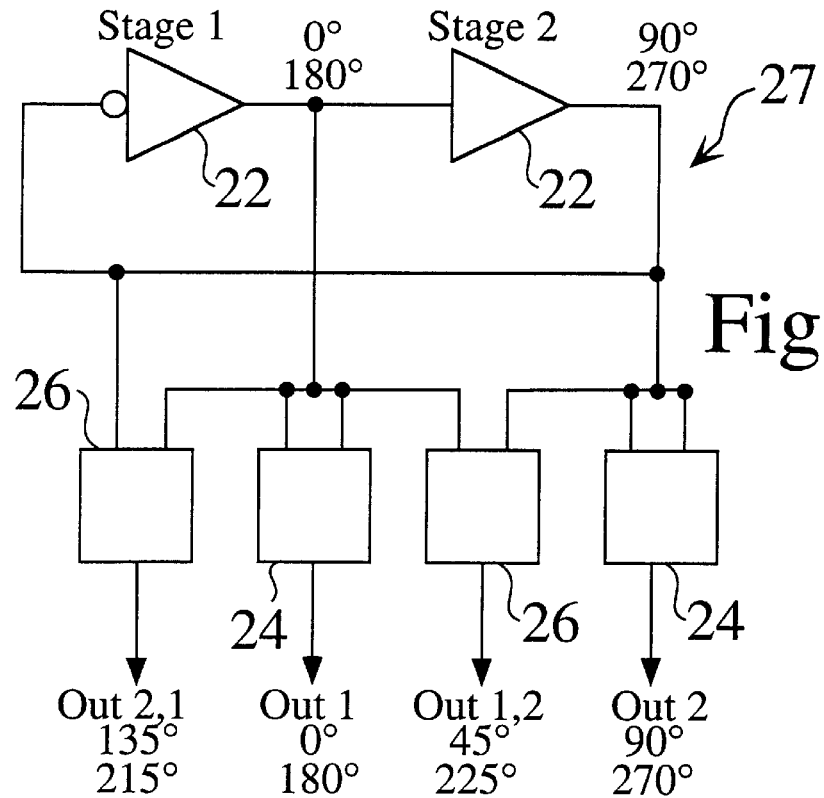
FIG. 2b illustrates generating extra phases by using interpolators in a two-stage oscillator.

The interleaved ring oscillator 40 also produces more output phases without resorting to external interpolators. Since the outputs 39 are generated by identical stages A–D, there is no need to match delays of interpolators 26 and dummy interpolators 24 (FIG. 2a, 2b) for the outputs to have evenly-spaced phases. While the interleaved ring oscillator 40 shown in FIG. 4a and 4b is not tunable, it has no phase spacing problems, as occurs with external interpolators.

One way to view the four-cell ring oscillator 40 of FIG. 4a is as a pair of cross-coupled "two-ring" oscillators, operating in quadrature, as shown in FIG. 4b. Cells A and C operate at phases of 0 and 180 degrees, while cells B and D operate at phases of 90 and 270 degrees. In addition, by symmetrically cross-coupling cells, B to C, C to D, D to A, and A to B respectively, two "two-stage" ring oscillators are formed. The two "two-stage" ring oscillators stay locked to each other, or "interleaved".

FIGS. 4a and 4b show a preferred way of interconnecting four mixer cells 42. In these figures, the "A" mixer cell 42a is shown as being driven by mixer cells D and C. However, there are several ways multiple mixer cells 42 can be interconnected to form a ring oscillator 40. For example, mixer cell A can be driven by mixer cells B and C, or by mixer cells B and D. However, some ways of interconnecting the mixer cells 42 are preferable to others, as will be discussed below.

Figure 5:
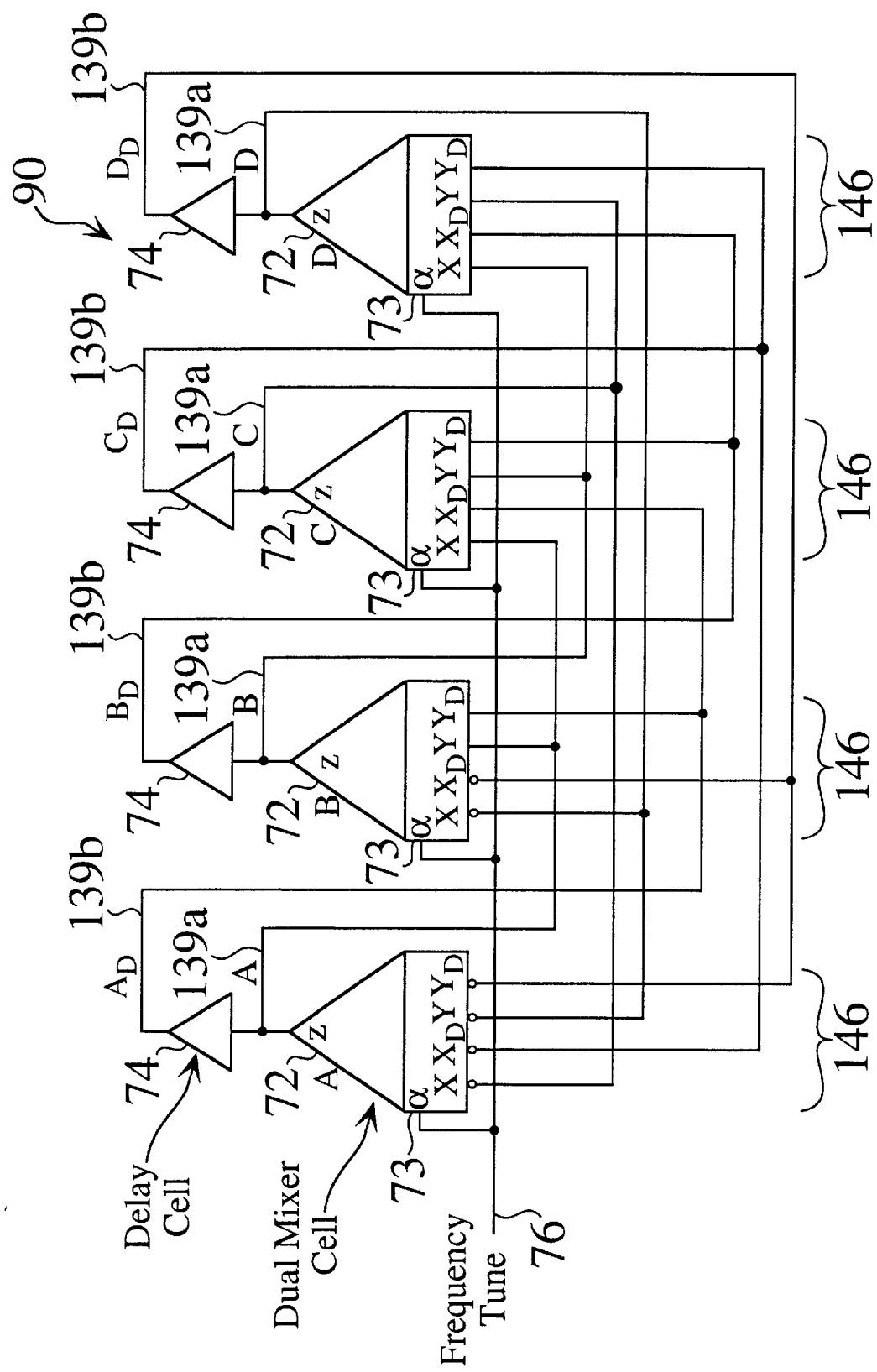
FIG. 5 shows a tunable interleaved oscillator diagram using four stages.

FIG. 5 shows a preferred embodiment of a four-stage, tunable interleaved ring oscillator 90, which is referred to in the first row of Table 1. Each stage 146 comprises a dual mixer cell 72 having an output 139a. The output of the dual mixer cell 72 is also connected to the delay cell 74. The delay cell 74 generates the second output 139b, which is delayed relative to output 139a, by the delay of the delay cell 74. Each dual mixer cell 72 has four inputs X, Y, $X_D$, and $Y_D$. Each dual mixer cell 72 also has a tuning input 73. The tuning inputs 73 of the four dual mixer cells 72 are connected to the oscillator tuning input 76. The oscillator tuning input 76 adjusts the operating frequency of the tunable interleaved ring oscillator 90, as described below. In each stage of the four-stage, tunable interleaved ring oscillator 90, the output signals 139a and 139b are taken from before and after the delay cells 74 to provide the output signals A, B, C, and D, and the delayed output signals $A_D$, $B_D$, $C_D$, and $D_D$.

In a practical embodiment of the interleaved ring oscillator 90, each of the single-ended inputs and outputs shown in FIG. 5 (as well as in FIG. 8, discussed below) is actually implemented as a two-conductor differential connection. However, only single-ended connections are shown to simplify the drawings.

Stages A, B, C and D of the preferred four-stage, tunable interleaved ring oscillator 90 are interconnected such that the non-delay inputs X and Y of each stage are connected to the non-delay outputs 139a of the two other stages shown in FIG. 4b, and the delay inputs $X_D$ and $Y_D$ of each stage are connected to the delay outputs 139b of two other stages shown in FIG. 4b. For example, the inputs X, $X_D$, Y, and $Y_D$ of stage A are connected to the outputs C and $C_D$ of stage C and to the outputs D and $D_D$ of stage D, respectively. Similarly, the inputs to stage B are connected to the outputs D and $D_D$ of stage D and to the outputs A and $A_D$ of stage A, the inputs to stage C are connected to the outputs A and $A_D$ of stage A and to the outputs B and $B_D$ of stage B, and the inputs to stage D are connected to the outputs B and $B_D$ of stage B and to the outputs C and $C_D$ of stage C.

In a four-stage, interleaved ring oscillator, there are three different ways of interconnecting the dual mixer cells 72, as shown in Table 1. The table also shows the resulting phase delay $T_E$ for each four-stage interleaved ring oscillator, in terms of the cell delay $T_D$. Some methods of interconnection between dual mixer cells 72 are more preferable than others, as discussed below. As will be described below with reference to the inversion of inputs, the prime symbol ' is used to indicate an inverted input. For example, in the first row of Table 1, C' indicates that the inversion of the output signal of stage C is used as an input to stage A.

TABLE 1

| Interconnections | $T_E$ | Unwanted Modes? | Comments |
|---|---|---|---|
| A = 0.5C' + 0.5D'<br>B = 0.5D' + 0.5A<br>C = 0.5A + 0.5B<br>D = 0.5B + 0.5C | $T_D/1.5$ | Unlikely | Preferred embodiment |
| A = 0.5B' + 0.5C'<br>B = 0.5C' + 0.5D'<br>C = 0.5D' + 0.5A<br>D = 0.5A + 0.5B | $T_D/2.5$ | Somewhat likely | |
| A = 0.5D' + 0.5B<br>B = 0.5A + 0.5C<br>C = 0.5B + 0.5D<br>D = 0.5C + 0.5A' | $T_D/4$ | Likely | |

Figure 6:
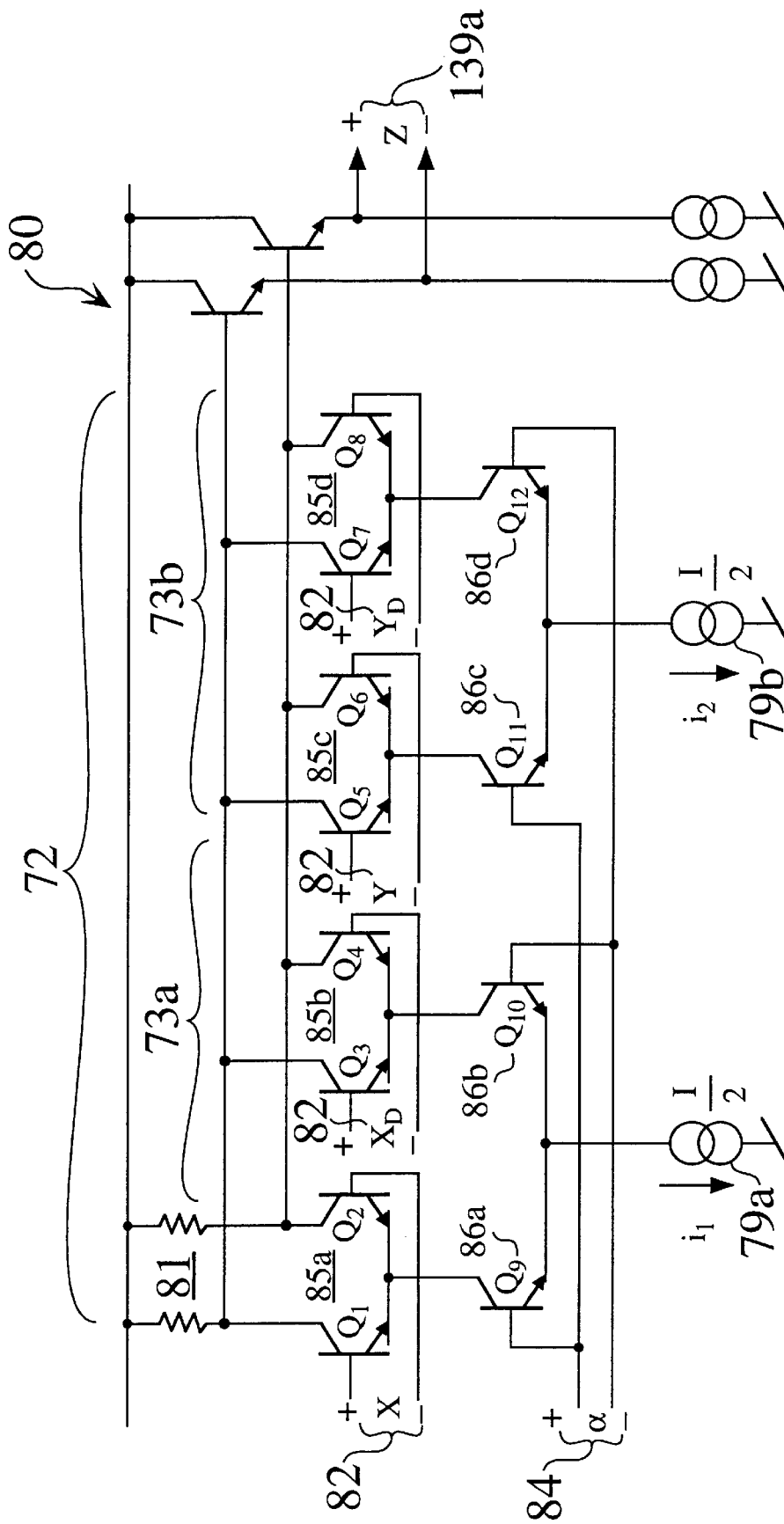
FIG. 6 is a schematic diagram of a dual delay-interpolating mixer according to the invention.

The preferred structure of the dual-input mixer 72 used in the four-stage, tunable interleaved ring oscillator 90 is shown in FIG. 6. The dual-input mixer 72 is based on the delay-interpolating mixer cell 34 shown in FIG. 3. To aid in understanding the circuit shown in FIG. 6, frequency tuning for the interpolating mixer cell 34 shown in FIG. 3 will first be described in more detail.

In FIG. 3, an analog tuning input 37 adjusts the relative current between the left differential transistor pair 33a and the right differential transistor pair 33b. At one end of the tuning range, the left transistor pair 33a is fully conducting, while the right transistor pair 33b is hardly conducting at all, so that nearly all the current from the current generator 35 passes through the left half 33a of the delay-interpolating mixer 34. Consequently, the output voltage is generated across the common collector resistors 31 in response to the input voltage 36. This results in a mixer delay equal to the delay of the delay-interpolating mixer 34 itself. At the other end of the tuning range, the left transistor pair 33b is hardly conducting at all, while the right transistor pair 33b is fully conducting, so that nearly all the current from the current generator 35 passes through the right half 33b of the delay-interpolating mixer 34. Consequently, the output voltage is generated across the collector resistors 31 in response to the input voltage delayed by the delay cell 32. This results in a mixer delay equal to the sum of the delays of both the delay-interpolating mixer 34 and the delay cell 32. Elsewhere in the tuning range, when both transistor pairs 33a and 33b are conducting, the output voltage across the collector resistors 31 is generated in response to a weighted sum of the input voltage 36 and the input voltage delayed by the delay cell 32. The weighting depends on the tuning voltage 37.

The dual-input mixer 72 shown in FIG. 6 combines four differential pairs of inputs 82 together, and can be thought of as two interconnected delay-interpolating mixers 34, which comprise a left half 73a and a right half 73b of the dual-input mixer 72. The delay interpolating mixers 34 both feed the common collector resistors 81 across which the output voltage 139 is generated. Each dual-input mixer 72 has a tuning input 84, four differential inputs 82 labelled X, $X_D$, Y, $Y_D$, and a differential output 139a labelled Z. Current generators 79a and 79b are connected to the left half 73a and a right half 73b of the dual-input mixer 72, respectively. The total current flowing through the collector resistors 81 is divided equally between the current generators 79a and 79b, as described below. When implemented within an interleaved ring oscillator, one of the outputs 139a and its delayed version 139b from a neighboring stage 146 are connected to differential inputs 82 X and $X_D$ respectively, while a second output 139a and its delayed version 139b from another neighboring stage 146 are connected to differential inputs 82 Y and $Y_D$ respectively.

Since equal currents $i_1$ and $i_2$ are conducted through the left half 73a and the right half 73b of the dual-input mixer 72, through the current generators 79a and 79b, the relative contributions of X and Y and of $X_D$ and $Y_D$ remain equally weighted in the output 139a Z. Therefore, the two non-delayed input pairs 139a entering each stage 146 are averaged with equal weighting by the dual-input mixer 72. The two delayed input pairs 139b are also averaged with equal weighting by the dual-input mixer 72. Alternatively, the input pairs may be combined with unequal weighting by setting the ratio between the currents $i_1$ and $i_2$ to a value different from 1.

In the preferred embodiment, the sum of the weights of input pairs X and $X_D$ is 0.5, and the same is true for input pairs Y and $Y_D$. Therefore, the "X" contribution to the output and the "Y" information contribution to the output remain constant at a 50:50 ratio. For example, in FIG. 5, for stage A, input signals from stages C and D are averaged, using signals C and D, connected to inputs X and Y of stage A, as well as signals $C_D$ and $D_D$, connected to inputs $X_D$ and $Y_D$ of stage A. The outputs and inputs of the stages 146 remain fully coupled by a fixed amount. Hence, the four stages 146 remain uniformly coupled together over the entire tuning range, resulting in a fully differential tuning system.

Referring again to the dual-input mixer 72 in FIG. 6, as the tuning input 84α is adjusted between 1 and −1, the relative weights given to the input pairs X and Y, and $X_D$ and $Y_D$ in the output Z of the dual-input mixer 72 are changed. Varying the tuning input 84α between 1 to −1 causes the left half 73a of the mixer cell 72 to change the proportion between inputs X and $X_D$, and causes the right half 73b to change the proportion between inputs Y and $Y_D$.

When α=−1, Z is nearly all $X_D$, $Y_D$, and there is essentially no X, Y contribution. When α=1, Z is nearly all X, Y, and there is essentially no $X_D$, $Y_D$ contribution. The frequency of the dual-input mixer 72 is continuously tunable between a frequency $f_{min}$, at which the delay of each dual-input mixer 72 is a maximum, and $f_{max}$, at which the delay of each dual-input mixer 72 is a minimum. Elsewhere in the tuning range, the frequency of the dual-input mixer 72 lies between a $f_{min}$ and $f_{max}$. The frequency depends upon the relative contributions of the non-delayed inputs X and Y and the delayed inputs $X_D$ and $Y_D$ to the output of each stage 146. When tuning input 84α=1, currents substantially equal to $i_1$ and $i_2$ flow through steering transistors Q9 and Q11. Consequently, transistor pairs Q1, Q2 and Q5, Q6 are fully conducting, while transistor pairs Q3, Q4 and Q7, Q8 are hardly conducting at all. Output Z is then derived solely and equally from inputs X and Y. If the mixer delay is denoted as $T_{DM}$, and recalling that phase delay $T_E=T_{DM}/1.5$ for the preferred four-stage oscillator 90 of FIG. 5 and Table 1, then the frequency of oscillation is given by $$f = \left(\frac{1.5}{8}\right) * \left(\frac{1}{T_{DM}}\right) \tag{1}$$

which is the maximum operating frequency $f_{max}$.

When tuning input 84α=−1, currents substantially equal to $i_1$ and $i_2$ flow through steering transistors Q10 and Q12.

Consequently, transistor pairs Q1, Q2 and Q5, Q6 are hardly conducting, while transistor pairs Q3, Q4 and Q7, Q8 are fully conducting. Output Z is then derived solely and equally from inputs $X_D$ and $Y_D$.

$$f\text{min} = \left(\frac{1.5}{8}\right) * \left(\frac{1}{T_{DM} + T_{DC}}\right) \qquad (2)$$

This realizes an interleaved oscillator that oscillates at the lowest frequency, where $T_{DC}$ is the delay of the delay cell 74.

In FIG. 6, the dual-input mixer 72 first does variable weight (i.e., tuning) summing between X and $X_D$ and between Y and $Y_D$, and then does fixed-weight summing between $(X+X_D)$ and $(Y+Y_D)$. The circuit shown in FIG. 6 can be alternatively be reconfigured to perform equal, fixed-weight summing of X and Y and of $X_D$ and $Y_D$, followed by variable-weight (i.e., tuning) summing between (X+Y) and $(X_D+Y_D)$.

As discussed above, there are multiple ways, referred to as topologies, in which multiple stages 146 of an interleaved ring oscillator can be interconnected. For example, in a four-stage, interleaved ring oscillator, there are three ways of interconnecting the dual-input mixer cells 72, as shown in Table 1.

A preferred interconnection topology is one in which the phases required for generating harmonics are much higher, possibly by a factor of 2 to 3, than the phase required for the oscillator to oscillate at the fundamental frequency. When this condition is met, the frequency roll-off of the stages 146 forming the interleaved ring oscillator causes such a large gain loss at the frequency of the next harmonic that oscillation at the harmonic frequency can not be supported. This provides stable operation at the fundamental frequency. The preferred four-stage interleaved ring oscillator 90 shown in FIG. 5 has been shown to be stable by both simulation and measurement.

The lowest spurious frequency mode is at a frequency of twice that of the fundamental mode. This frequency is generally well down on the gain-bandwidth curve of the stages 146. Two other topologies (rows 2 and 3 in Table 1) are possible for a four-cell interleaved oscillator. For example, output A can also be derived from inputs B' and C', or from inputs B and D'. These connections yield phase delays of $T_E = T_D/2.5$ and $T_E = T_D/4$, respectively. However, interconnecting the stages with these topologies permits the resulting ring oscillator to oscillate at frequencies other than the fundamental frequency. The possibility of the oscillator having such unwanted modes is listed as being "somewhat likely" or "likely" in Table 1, since when the stages are interconnected as indicated, the oscillator has spurious modes of oscillation that fall within the amplifier gain profile. In simulation, these alternative topologies show hopping between various modes, as the ring oscillator is tuned. For some interleaved ring oscillator embodiments that have spurious modes of oscillation that fall within the amplifier gain profile, the oscillators must be preset to a known state to guarantee that they oscillate at a desired frequency.

Figure 7:
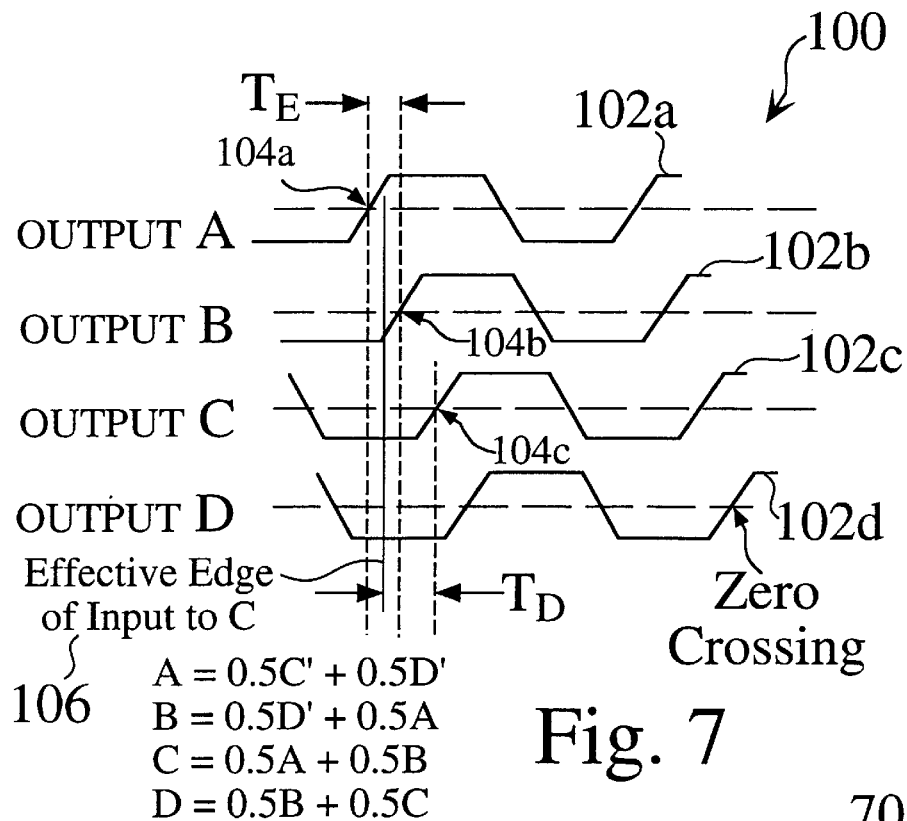
FIG. 7 is a graph that compares phase relationships between oscillator elements.

FIG. 7 is a graph 100 that shows phase relationships between the four output waveforms 102 a–d generated by the four stages A, B, C and D 146 for the preferred ring oscillator 90 of FIG. 5. The output of stage C 102c is derived from the weighted sum of the outputs of stages A 102a and B 102b. The time spacing between the outputs of stages A and B ($T_E$) is 1/1.5 of the delay $T_D$ of the stage. This can be understood by realizing that the effective input edge 106 to stage C occurs at a time midway between the times at which edges occur in the outputs of stages A and B (104a and 104b). Then, at a time equal to the gate delay $T_D$ of stage C after the effective input edge 106, the output 102c of stage C changes state. The dual-input mixer cell 72 of stage C averages the outputs of stages A and B with equal weighting, so that the transitions 104a and 104b become the effective edge 106. Consequently, the midpoint 104c of the edge in the output 102c of stage C occurs following the gate delay $T_D$ of stage C.

In a similar manner, half of the output of stage C and half of the output of stage B are used to generate the input of stage D. To generate the input of stage A, inversions C' of the output of stage C and D' of the output of stage D are used. To generate the input of stage B, the output of stage A and D' of the output of stage D are used.

In all embodiments of the invention, which are comprised of a total of three or more total stages, each stage is driven by two previous stages, in a symmetrical way.

Figure 8:
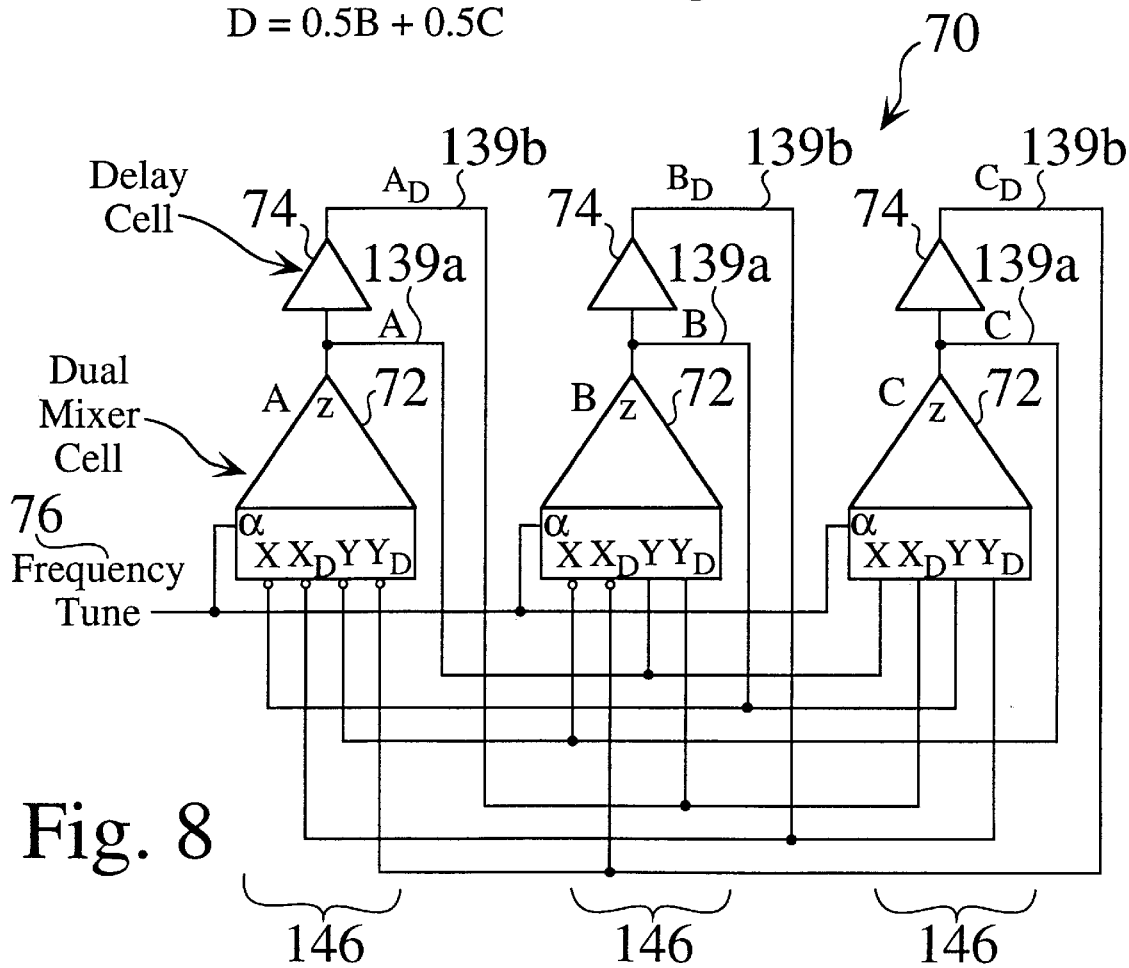
FIG. 8 shows a tunable interleaved oscillator diagram using three stages.

FIG. 8 is a single-ended schematic of a frequency-tunable interleaved oscillator 70 having three stages 146, in which each stage 146 comprises a dual-input mixer cell 72 (FIG. 6) driven by the output of two other mixer cells, a delay cell 74, an output 139a and a delayed output 139b. The inputs to stage A are driven by outputs from stages B and C, the inputs to stage B are driven by outputs from stages C and A, and the inputs to stage C are driven by outputs from stages A and B. A tuning signal 76 is used to adjust the operating frequency of the interleaved ring oscillator 70, as discussed above.

Although the invention is described herein with reference to the preferred embodiment, one skilled in the art will readily appreciate that other applications may be substituted for those set forth herein without departing from the scope of the present invention. Accordingly, the invention should only be limited by the claims included below.

We claim:

1. A ring oscillator, comprising:
   at least three mixer cells, each of said mixer cells having a pair of first inputs, a pair of second inputs, a first output, and a second output, said second output being delayed relative to said first output;
   each of said mixer cells being symmetrically connected to two other of said mixer cells; said first pair of inputs of each of said mixer cells being symmetrically connected to said first outputs of said two other of said mixer cells; and
   said second pair of inputs of each of said mixer cells being symmetrically connected to said second delayed outputs of said two other of said mixer cells.

2. The ring oscillator of claim 1, wherein each of said first inputs, said second inputs, said first outputs and said second delayed outputs of said mixer cells is a differential connection.

3. The ring oscillator of claim 1, wherein said mixer cells and said two other of said mixer cells are symmetrically connected to prevent oscillation at harmonic frequencies.

4. The ring oscillator of claim 1, wherein said mixer cells and said two other of said mixer cells are symmetrically interconnected such that said ring oscillator has an oscillating frequency higher than $1/(2*N*T_D)$, where N is the total number of said mixer cells, and $T_D$ is the time delay of each of said mixer cells.

5. The ring oscillator of claim 1, wherein each of said mixer cells includes means for combining said first outputs of said two other mixer cells with a predetermined weighting, and for combining said second delayed outputs of said two other mixer cells with a predetermined weighting.

6. The ring oscillator of claim 5, additionally comprising means for tuning between relative contributions of said combined first outputs of said two other of said mixer cells and said combined second delayed outputs of said two other of said mixer cells.

7. The ring oscillator of claim 5, in which each of said mixer cells has a first time delay between a combination of said pair of first inputs and said first output of each of said mixer cells and in which said second output of each of said mixer cells is delayed relative to said first output by a second delay, said ring oscillator additionally comprising means for continuously tuning between a delay equal to said first time delay of each of said mixer cells and a delay equal to the sum of said first time delay of each of said mixer cells and said second delay of each of said mixer cells.

8. A ring oscillator, comprising:

at least three mixer cells, each of said mixer cells having a pair of first differential inputs, a pair of second differential inputs, a first differential output, and a second differential output delayed relative to said first differential output;

each of said mixer cells being symmetrically connected to two other of said mixer cells; said first differential input pair of each of said mixer cells being symmetrically connected to said first differential outputs of said two other of said mixer cells; and said second differential input pair of each of said mixer cells being symmetrically connected to said second delayed differential outputs of said two other of said mixer cells.

9. The ring oscillator of claim 8, wherein said mixer cells and said two other of said mixer cells are symmetrically connected to prevent oscillation at harmonic frequencies.

10. The ring oscillator of claim 8, wherein said mixer cells and said two other of said mixer cells are symmetrically connected such that said ring oscillator has an oscillating frequency higher than $1/(2*N*T_D)$, where N is equal to the total number of said mixer cells, and $T_D$ is the time delay of each of said mixer cells.

11. The ring oscillator of claim 8, wherein each of said mixer cells includes means for combining said first differential outputs of said two other mixer cells with a predetermined weighting, and for combining said second delayed differential outputs of said two other mixer cells with a predetermined weighting.

12. The ring oscillator of claim 11, additionally comprising means for tuning between relative contributions of said combined first differential outputs of said two other of said mixer cells and said combined second delayed differential outputs of said two other of said mixer cells.

13. The ring oscillator of claim 11, in which each of said mixer cells has a first time delay between a combination of said first pair of differential inputs and said first differential output of each of said mixer cells and in which said second differential output of each of said mixer cells is delayed relative to said first differential output by a second delay, said ring oscillator additionally comprising means for continuously tuning between a delay equal to said first time delay of each of said mixer cells and a delay equal to the sum of said first time delay of each of said mixer cells and said second delay of each of said mixer cells.

14. A ring oscillator, comprising:

a first mixer cell having two input pairs, a first output, and a second output delayed relative to said first output;

a second mixer cell having two input pairs, a first output, and a second output delayed relative to said first output;

a third mixer cell having two input pairs, a first output, and a second output delayed relative to said first output; and a fourth mixer cell having two input pairs, a first output, and a second output delayed relative to said first output;

said two input pairs of said third mixer cell being symmetrically connected to said first output and said second delayed outputs of said first and second mixer cells, said two input pairs of said fourth mixer cell being symmetrically connected to said first output and said second delayed outputs of said second and third mixer cells, said two input pairs of said first mixer cell being symmetrically connected to inverted said first output and said second delayed outputs of said third and fourth mixer cells, said two input pairs of said second mixer cell being symmetrically connected to inverted said first output and said second delayed outputs of said fourth mixer cell, and to said first output and said second delayed outputs of said first mixer cell.

15. The ring oscillator of claim 14, wherein each of said first inputs, said second inputs, said first outputs and said second delayed outputs of said mixer cells is a differential connection.

16. The ring oscillator of claim 14, wherein said mixer cells and said two other of said mixer cells are symmetrically connected to prevent oscillation at harmonic frequencies.

17. The ring oscillator of claim 14, wherein said mixer cells and said two other of said mixer cells are symmetrically connected such that said ring oscillator has an oscillating frequency higher than $1/(2*N*T_D)$, where N is equal to the total number of said mixer cells, and $T_D$ is the time delay of each of said mixer cells.

18. The ring oscillator of claim 14, wherein each of said mixer cells includes means for combining said first outputs of said two other mixer cells with a predetermined weighting, and for combining said second delayed outputs of said two other mixer cells with a predetermined weighting.

19. The ring oscillator of claim 18, additionally comprising means for tuning between relative contributions of said combined first outputs of said two other of said mixer cells and said combined second delayed outputs of said two other of said mixer cells.

20. The ring oscillator of claim 18, in which each of said mixer cells has a first time delay between a combination of said first input pair and said first output of each of said mixer cells and in which said second output of each of said mixer cells is delayed relative to said first output by a second delay, said ring oscillator additionally comprising means for continuously tuning between a delay equal to said first time delay of each of said mixer cells and a delay equal to the sum of said first time delay of each of said mixer cells and said second delay of each of said mixer cells.

* * * * *